(12) United States Patent
Chang et al.

(10) Patent No.: US 10,867,836 B2
(45) Date of Patent: Dec. 15, 2020

(54) WAFER STACK AND FABRICATION METHOD THEREOF

(71) Applicant: TAIWAN SEMICONDUCTOR MANUFACTURING CO., LTD., Hsinchu (TW)

(72) Inventors: Kuei-Sung Chang, Kaohsiung (TW); Ching-Ray Chen, Taipei (TW); Yen-Cheng Liu, New Taipei (TW); Shang-Ying Tsai, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/219,523

(22) Filed: Jul. 26, 2016

(65) Prior Publication Data

US 2017/0316969 A1  Nov. 2, 2017

Related U.S. Application Data

(60) Provisional application No. 62/330,284, filed on May 2, 2016.

(51) Int. Cl.
*H01L 21/762* (2006.01)
*H01L 23/00* (2006.01)

(52) U.S. Cl.
CPC ........ *H01L 21/76256* (2013.01); *H01L 24/94* (2013.01); *H01L 2224/94* (2013.01)

(58) Field of Classification Search
None
See application file for complete search history.

(56) References Cited

U.S. PATENT DOCUMENTS

| | | | | |
|---|---|---|---|---|
| 5,668,045 A | * | 9/1997 | Golland | ............ H01L 21/76251 438/459 |
| 6,624,047 B1 | * | 9/2003 | Sakaguchi | ........ H01L 21/76259 438/458 |
| 2002/0023725 A1 | * | 2/2002 | Bryan | .................. B28D 5/0011 156/755 |
| 2003/0008478 A1 | * | 1/2003 | Abe | ........................ B24B 9/065 438/459 |
| 2003/0013273 A1 | * | 1/2003 | Naruoka | ............ H01L 21/67092 438/455 |
| 2003/0092244 A1 | * | 5/2003 | Oi | .......................... H01L 21/681 438/455 |

(Continued)

*Primary Examiner* — Khaja Ahmad
(74) *Attorney, Agent, or Firm* — McClure, Qualey & Rodack, LLP

(57) ABSTRACT

A semiconductor device includes a first wafer and a second wafer. The first wafer has a top portion. The second wafer is disposed on the top portion of the first wafer, wherein the second wafer has a bottom portion bonded on the top portion of the first wafer, and a non-bonded area of the bottom portion has a width smaller than 0.5 mm. The bottom portion of the second wafer has a size smaller than or equal to that of the top portion of the first wafer. In some embodiments, the top portion of the first wafer has first rounded corners, and the bottom portion of the second wafer has second corners. A cross-sectional view of each of the second rounded corners has a radius smaller than that of each of first rounded corners. In some embodiments, the bottom portion of the second wafer has right angle corners.

20 Claims, 20 Drawing Sheets

(56) References Cited

U.S. PATENT DOCUMENTS

| | | | |
|---|---|---|---|
| 2004/0246795 A1* | 12/2004 | Tomita | H01L 21/76251 365/200 |
| 2007/0072393 A1* | 3/2007 | Aspar | H01L 21/304 438/459 |
| 2008/0268614 A1* | 10/2008 | Yang | H01L 21/2007 438/455 |
| 2009/0095399 A1* | 4/2009 | Zussy | H01L 21/76251 156/60 |
| 2010/0108891 A1* | 5/2010 | Cox | G01N 21/3581 250/341.8 |
| 2011/0073983 A1* | 3/2011 | Tanida | H01L 27/14603 257/466 |
| 2011/0097874 A1* | 4/2011 | Broekaart | H01L 21/304 438/459 |
| 2011/0230005 A1* | 9/2011 | Vaufredaz | H01L 21/304 438/73 |
| 2013/0078785 A1* | 3/2013 | Zussy | H01L 21/76251 438/459 |
| 2014/0242779 A1* | 8/2014 | Nakamura | H01L 25/50 438/459 |
| 2016/0343629 A1* | 11/2016 | Rajoo | H01L 24/29 |

* cited by examiner

WAFER STACK AND FABRICATION METHOD THEREOF

RELATED APPLICATIONS

This application claims priority to U.S. Provisional Application Ser. No. 62/330,284, filed May 2, 2016, which is herein incorporated by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the wafer stacking technique. As the development of the wafer stacking technique is proceeding, wafer bonding is needed, and various thin-down processes are used to decrease a thickness of a wafer stack. However, conventional methods for fabricating a wafer stack have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1b is a cross-sectional view along a cut line A-A' in FIG. 1a.

FIG. 2b is a cross-sectional view along a cut line B-B' in FIG. 2a.

FIG. 3b is a cross-sectional view along a cut line C-C' in FIG. 3a.

FIG. 4b is a cross-sectional view along a cutline D-D' in FIG. 4a.

FIG. 5b is a cross-sectional view along a cutline E-E' in FIG. 4a.

FIG. 8b is a cross-sectional view along a cutline E-E' in FIG. 8a.

DETAILED DESCRIPTION

Figure 1A:
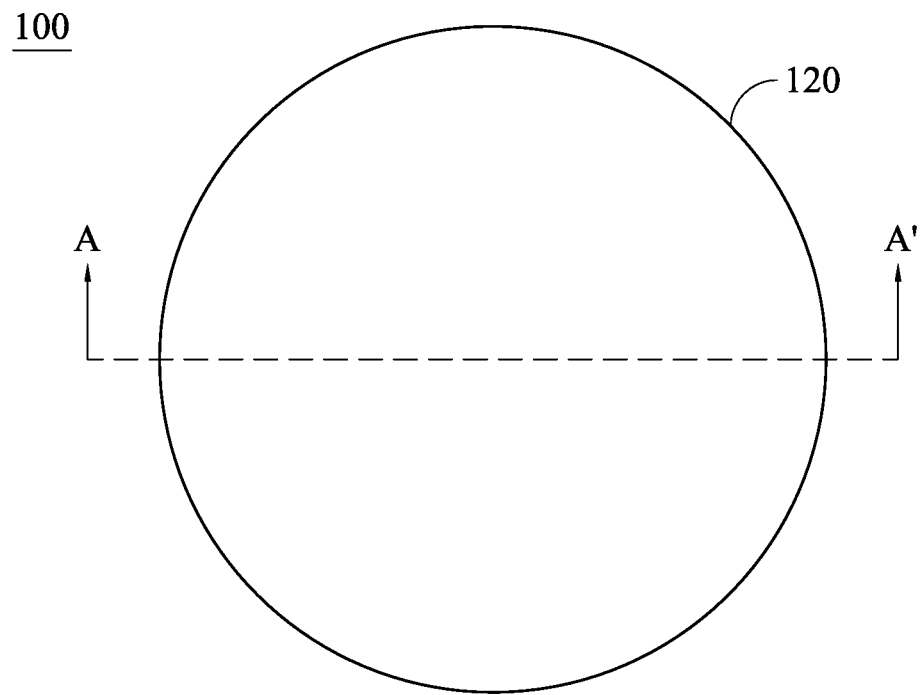
FIG. 1a is a top view of a semiconductor device 100 in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a wafer stack and a fabrication method thereof. In the fabrication method, at first, a first wafer is provided. In an embodiment, the first wafer is a standard wafer having first rounded corners on a top portion thereof. Then, a second wafer is provided. A bottom portion of the second wafer has a size smaller than or equal to that of the top portion of the first wafer. In an embodiment, the bottom portion of the second wafer has right angle corners. In another embodiment, the bottom portion of the second wafer has second rounded corners, and each of the second rounded corners has a radius smaller than that of each of the first rounded corners. Thereafter, the bottom portion of the second wafer is bonded on the top portion of the first wafer. Then, a thin-down process is performed on the second wafer to decrease a thickness of the second wafer. Then the thin-down process is performed, a force is applied on a top portion of the second wafer. In the embodiments of the present disclosure, the configuration of the second wafer enables the second wafer to avoid chipping caused by the force.

Figure 1B:
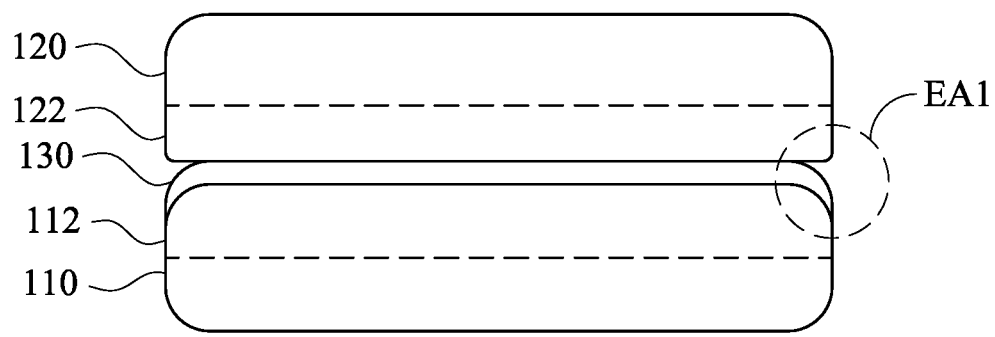

Referring to FIG. 1a and FIG. 1b, FIG. 1a is a top view of a semiconductor device 100 in accordance with some embodiments of the present disclosure, and FIG. 1b is a cross-sectional view along a cut line A-A' in FIG. 1a. The semiconductor device 100 is a wafer stack including a first wafer 110 and a second wafer 120. The first wafer 110 is a standard wafer having a standard configuration, and the second wafer 120 is bonded on the first wafer 110. In this embodiment, an oxide layer 130 is disposed between the first wafer 110 and the second wafer 120 for fusion bonding. For example, the oxide layer 130 is disposed on the first wafer 110, and then the second wafer 120 is bonded on the first wafer 110 through the oxide layer 130. However, embodiments of the present disclosure are not limited thereto. In some embodiments, the second wafer 120 is bonded on the first wafer 110 by an anodic bonding process or an adhesive bonding process.

Each of the first wafer 110 and the second wafer 120 may be a semiconductor material and may include structures including a graded layer or a buried oxide, for example. In some embodiments, each of the first wafer 110 and the second wafer 120 includes bulk silicon that may be undoped or doped (e.g., p-type, n-type, or a combination thereof). Other materials that are suitable for semiconductor device formation may be used. Other materials, such as, fused silica, germanium, quartz, sapphire, and glass could alternatively be used for the first wafer 110 and the second wafer 120. In addition, each of the first wafer 110 and the second wafer 120 may contain Complementary Metal-Oxide-Semiconductor (CMOS) circuits, sensors/actuators, passive devices, Wafer Level Chip Scale Package (WLCSP), interposers, etc. However, embodiments of the present disclosure are not limited thereto.

The second wafer 120 has a size the same as that of the first wafer 110. In this embodiment, the first wafer 110 and the second wafer 120 are circular wafer, and a diameter of the second wafer 120 is the same as a diameter of the first wafer 110, and thus the second wafer 120 has a width the same as a width of the first wafer 110 in the cross-sectional view of FIG. 1b. The second wafer 120 has a bottom portion 122 bonded on a top portion 112 of the first wafer 110, and cross-sectional views of the top portion 112 and the bottom portion 122 has rounded corners.

Figure 1C:
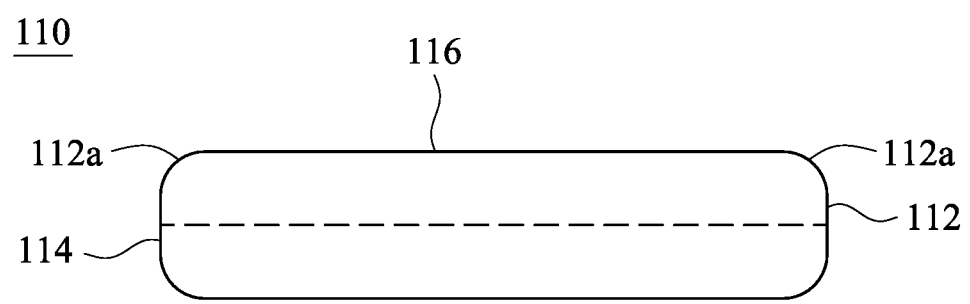
FIG. 1c is a cross-sectional view of a first wafer in accordance with some embodiments.
Figure 1D:
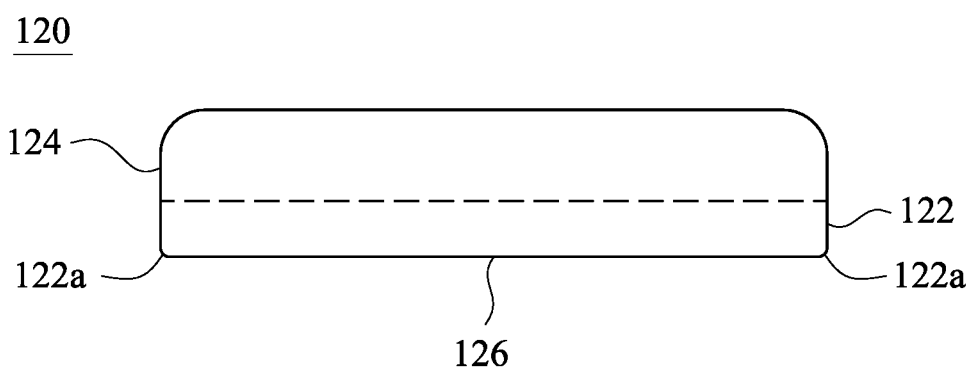
FIG. 1d is a cross-sectional view of a second wafer in accordance with some embodiments.
Figure 1E:
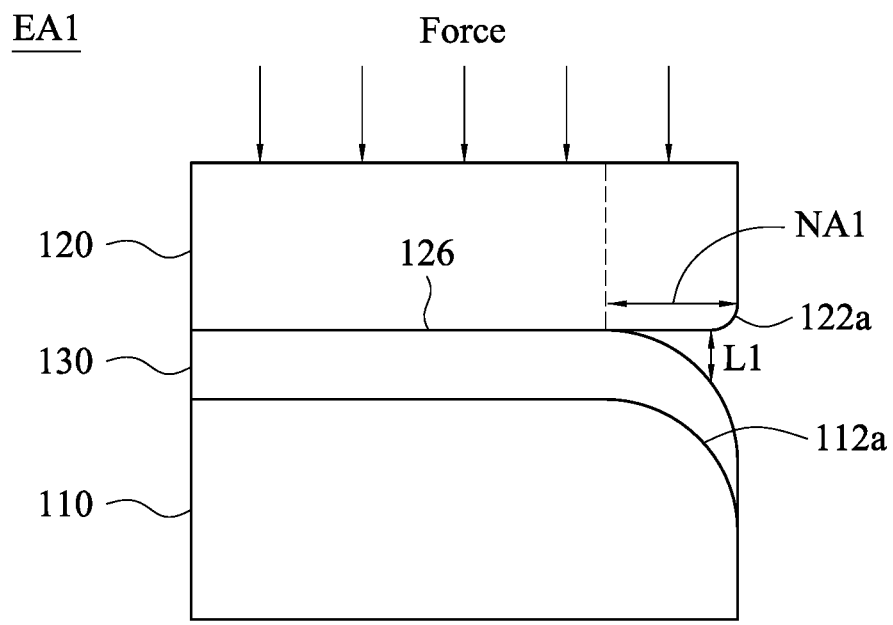
FIG. 1e is an enlarged diagram showing the area EA1 in FIG. 1b.

Referring to FIG. 1c and FIG. 1d, FIG. 1c is a cross-sectional view of the first wafer 110 in accordance with some embodiments of the present disclosure, and FIG. 1d is a cross-sectional view of the second wafer 120 in accordance with some embodiments of the present disclosure. The top portion 112 of the first wafer 110 has the rounded corners 112a, and the rounded corners 112a are defined between a side surface 114 and a top surface 116 of the first wafer 110. Similarly, the bottom portion 122 of the second wafer 120 has the rounded corners 122a, and the rounded corners 122a are defined by a side surface 124 and a bottom surface 126 of the second wafer 120. In this embodiment, each of the rounded corners 122a is designed to have a radius smaller than that of each of the rounded corners 112a, thereby decreasing an area of a non-bonded area NA1 of the second wafer 120, as shown in FIG. 1e. In this embodiment, a portion of the bottom surface 126 from an edge of the second wafer 120 to a location contacting the oxide layer 130 is defined as the non-bonded area NA1.

Referring to FIG. 1e, FIG. 1e is an enlarged diagram showing the area EA1 in FIG. 1b. When a thin-down process, such as a grind process or a Chemical Mechanical Planarization process (CMP), is performed on the semiconductor device 100 to decrease a thickness of the second wafer 120, a force is applied on the second wafer 120 and causes the edge of the second wafer 120 chipping. The chipping risk of the second wafer 120 has a positive correlation to a distance L1 between the oxide layer 130 and the non-bonded area NA1 of the second wafer 120, and the distance L1 has a positive correlation to an area of the non-bonded area NA1. In this embodiment, to decrease the chipping risk of the second wafer 120, the second wafer 120 is designed to have small rounded corners 122a to decrease an area of the non-bonded area NA1, and the distance L1 is deceased accordingly. Since the distance L1 is decreased, the chipping risk of the second wafer 120 is decreased. For example, comparing to a conventional wafer stack having a standard wafer (also referred to as conventional top wafer) bonded on another standard wafer, the second wafer 120 has a chipping risk less than that of the conventional top wafer when the thin-down process is performed, since the top wafer has corners larger than those of the second wafer 120.

Figure 1F:
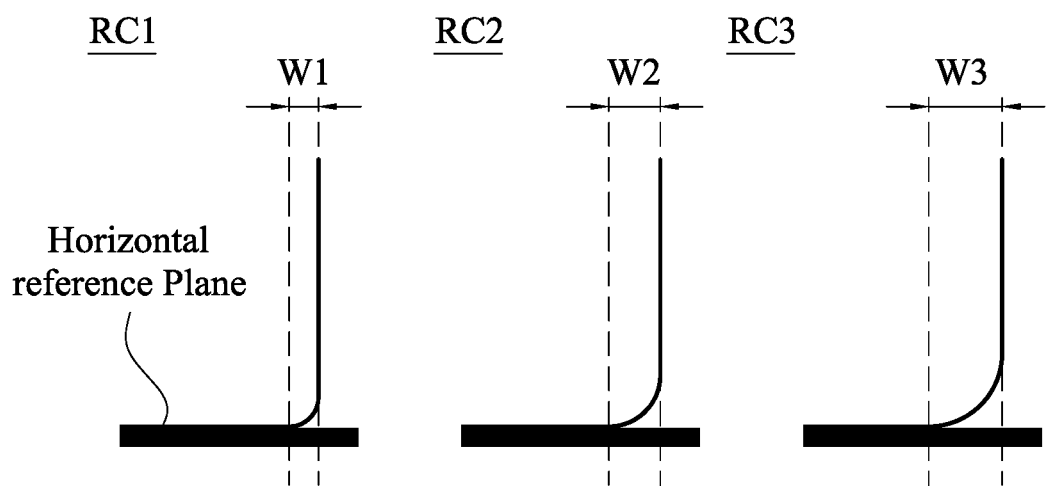
FIG. 1f is a schematic diagram showing different rounded corners in accordance with some embodiments.

Referring to FIG. 1f, FIG. 1f is a schematic diagram showing different rounded corners RC1-RC3 in accordance with some embodiments of the present disclosure. The rounded corner RC1 has a non-bonded area having a width W1 equal to 0.33 mm, and the rounded corner RC3 has a non-bonded area having a width W3 equal to 0.5 mm, and the rounded corner RC2 has a non-bonded area having a width W2 between 0.33 mm and 0.5 mm. AS shown in FIG. 1g, when the corner radius is decreased, the non-bonded area is decreased accordingly. In some embodiments, the bottom portion 122 of the second wafer 120 can be designed to have the rounded corner RC1, the rounded corner RC2, or the rounded corner RC3. In some embodiments, the rounded corner 122a of the second wafer 120 has a non-bonded area having a width smaller than 0.5 mm. In some embodiments, the rounded corner 122a of the second wafer 120 has a non-bonded area having a width smaller than 0.3 mm.

Figure 2A:
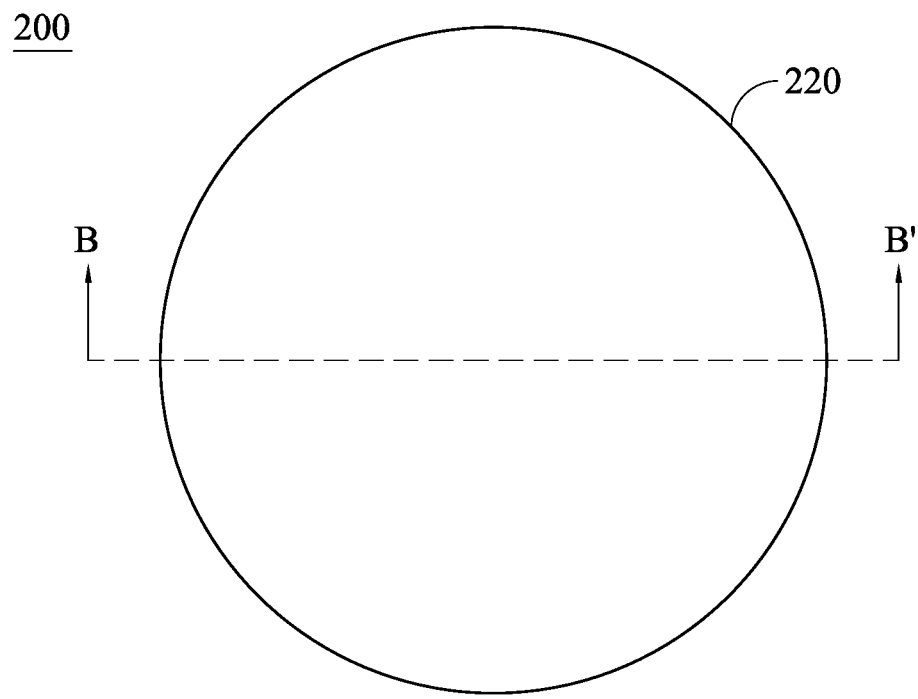
FIG. 2a is a top view of a semiconductor device in accordance with some embodiments.
Figure 2B:
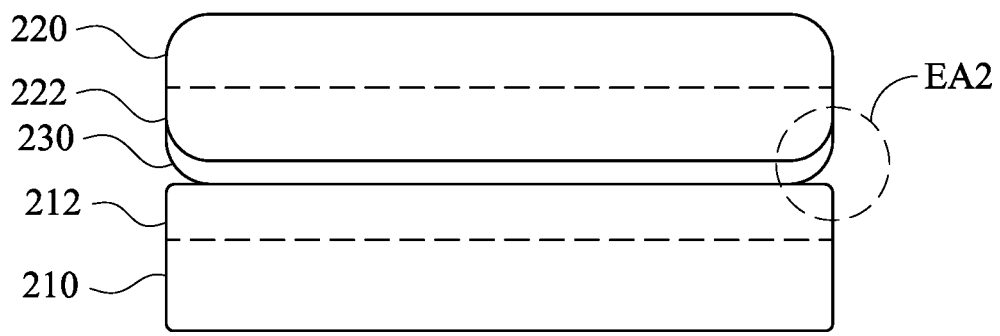

Referring to FIG. 2a and FIG. 2b, FIG. 2a is a top view of a semiconductor device 200 in accordance with some embodiments of the present disclosure, and FIG. 2b is a cross-sectional view along a cut line B-B' in FIG. 2a. The semiconductor device 200 is a wafer stack including a first wafer 210 and a second wafer 220. The second wafer 220 is a standard wafer having a standard configuration, and bonded on the first wafer 210. In this embodiment, an oxide layer 230 is disposed between the first wafer 210 and the second wafer 220 for fusion bonding. For example, the oxide layer 230 is disposed on the second wafer 220, and then the first wafer 210 is bonded on the second wafer 220 through the oxide layer 230. However, embodiments of the present disclosure are not limited thereto. In some embodiments, the first wafer 210 is bonded on the second wafer 220 by an anodic bonding process or an adhesive bonding process.

Each of the first wafer 210 and the second wafer 220 may be a semiconductor material and may include structures including a graded layer or a buried oxide, for example. In some embodiments, each of the first wafer 210 and the second wafer 220 includes bulk silicon that may be undoped or doped (e.g., p-type, n-type, or a combination thereof). Other materials that are suitable for semiconductor device formation may be used. Other materials, such as, fused silica, germanium, quartz, sapphire, and glass could alternatively be used for the first wafer 210 and the second wafer 220. In addition, each of the first wafer 210 and the second wafer 220 may contain Complementary Metal-Oxide-Semiconductor (CMOS) circuits, sensors/actuators, passive devices, Wafer Level Chip Scale Package (WLCSP), interposers, etc. However, embodiments of the present disclosure are not limited thereto.

The second wafer 220 has a size the same as that of the first wafer 210. In this embodiment, the first wafer 210 and the second wafer 220 are circular wafer, and a diameter of the second wafer 220 is the same as a diameter of the first wafer 210, and thus the second wafer 220 has a width the same as a width of the first wafer 210 in the cross-sectional view of FIG. 2b. The first wafer 210 has a top portion 212 bonded on a bottom portion 222 of the second wafer 220, and cross-sectional views of the top portion 212 and the bottom portion 222 has rounded corners.

Figure 2C:
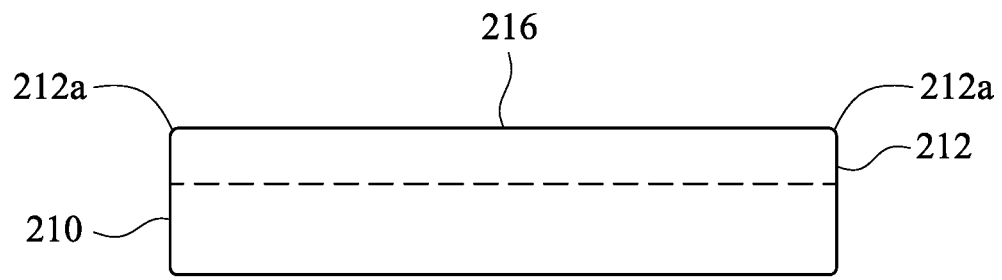
FIG. 2c is a cross-sectional view of a first wafer in accordance with some embodiments.
Figure 2D:
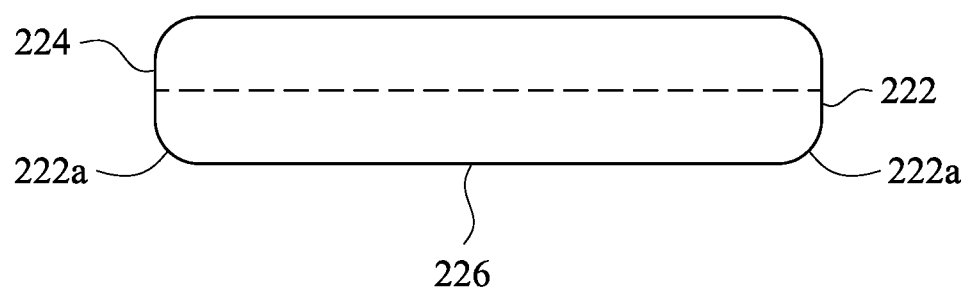
FIG. 2d is a cross-sectional view of a second wafer in accordance with some embodiments.
Figure 2E:
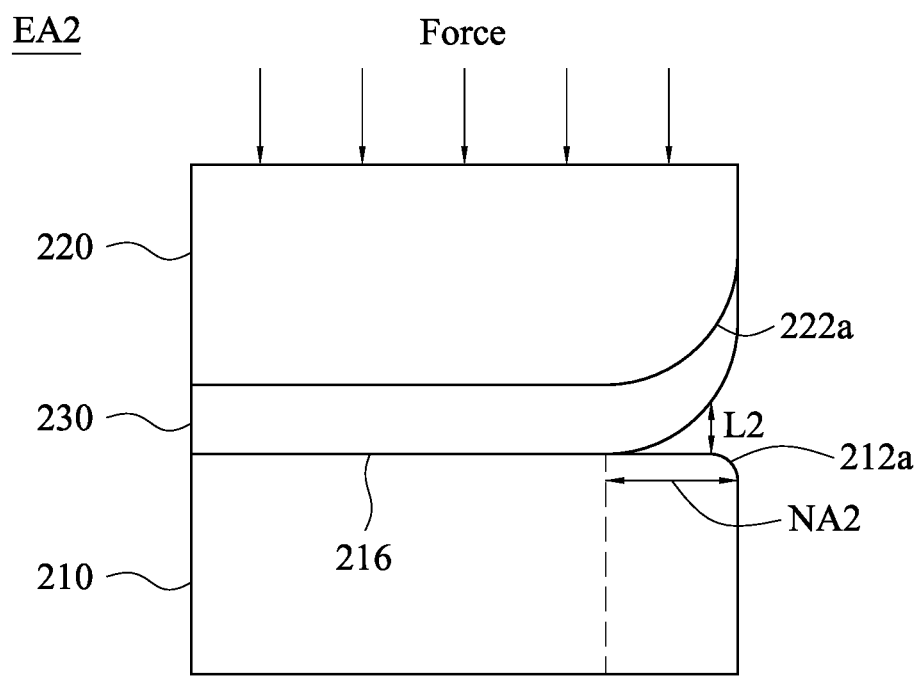
FIG. 2e is an enlarged diagram showing the area EA2 in FIG. 2b.

Referring to FIG. 2c and FIG. 2d, FIG. 2c is a cross-sectional view of the first wafer 210 in accordance with some embodiments of the present disclosure, and FIG. 2d is a cross-sectional view of the second wafer 220 in accordance with some embodiments of the present disclosure. The top portion 212 of the first wafer 210 has the rounded corners 212a, and the rounded corners 212a are defined by a side surface 214 and a top surface 216 of the first wafer 210. Similarly, the bottom portion 222 of the second wafer 220 has the rounded corners 222a, and the rounded corners 222a are defined by a side surface 224 and a bottom surface 226 of the second wafer 220. In this embodiment, each of the rounded corners 212a is designed to have a radius smaller than that of each of the rounded corners 212a, thereby decreasing an area of a non-bonded area NA2 of the first wafer 210, as shown in FIG. 2e. In this embodiment, a portion of the top surface 216 from an edge of the first wafer 210 to a location contacting the oxide layer 230 is defined as the non-bonded area NA2.

Referring to FIG. 2e, FIG. 2e is an enlarged diagram showing the area EA2 in FIG. 2b. When a thin-down process is performed on the semiconductor device 200 to decrease a thickness of the second wafer 220, a force is applied on the second wafer 220 and causes the edge of the second wafer 220 chipping. The chipping risk of the second wafer 220 has a positive correlation to a distance L2 between the oxide layer 230 and the non-bonded area NA2 of the first wafer 210, and the distance L2 has a positive correlation to an area of the non-bonded area NA2. In this embodiment, to decrease the chipping risk of the second wafer 220, the first wafer 210 is designed to have small rounded corners 212a to decrease an area of the non-bonded area NA2, and the distance L2 is deceased accordingly. Since the distance L2 is decreased, the chipping risk of the second wafer 220 is decreased. For example, comparing to a wafer stack having a standard wafer (also referred to as conventional top wafer) bonded on another standard wafer (also referred to as conventional bottom wafer), the second wafer 220 has a chipping risk less than that of the conventional top wafer when the thin-down process is performed, since the conventional bottom wafer has corners larger than those of the first wafer 210.

Similarly, the top portion 212 of the first wafer 210 can be designed to have the rounded corner RC1, the rounded corner RC2, or the rounded corner RC3 as shown in FIG. 1f. In some embodiments, the rounded corner 212a of the first wafer 210 has a non-bonded area having a width smaller than 0.5 mm. In some embodiments, the rounded corner 212a of the first wafer 210 has a non-bonded area having a width smaller than 0.3 mm.

Figure 3A:
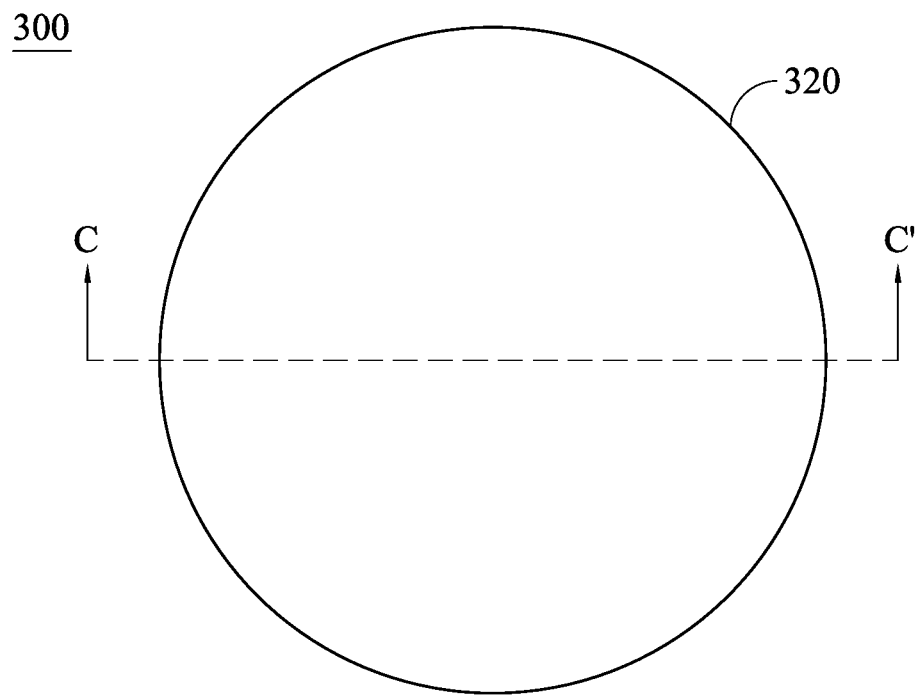
FIG. 3a is a top view of a semiconductor device 300 in accordance with some embodiments.
Figure 3B:
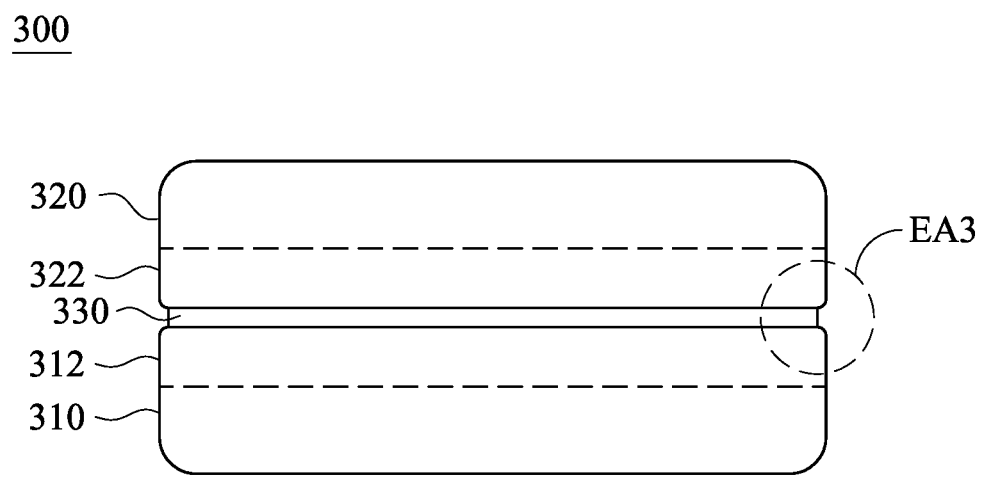

Referring to FIG. 3a and FIG. 3b, FIG. 3a is a top view of a semiconductor device 300 in accordance with some embodiments of the present disclosure, and FIG. 3b is a cross-sectional view along a cut line C-C' in FIG. 3a. The semiconductor device 300 is a wafer stack including a first wafer 310 and a second wafer 320, and the second wafer 320 is bonded on the first wafer 310. In this embodiment, an oxide layer 330 is disposed between the first wafer 310 and the second wafer 320 for fusion bonding. For example, the oxide layer 330 is disposed on the first wafer 310, and then the second wafer 320 is bonded on the first wafer 310 through the oxide layer 330. However, embodiments of the present disclosure are not limited thereto. In some embodiments, the second wafer 320 is bonded on the first wafer 310 by an anodic bonding process or an adhesive bonding process.

Each of the first wafer 310 and the second wafer 320 may be a semiconductor material and may include structures including a graded layer or a buried oxide, for example. In some embodiments, each of the first wafer 310 and the second wafer 320 includes bulk silicon that may be undoped or doped (e.g., p-type, n-type, or a combination thereof). Other materials that are suitable for semiconductor device formation may be used. Other materials, such as, fused silica, germanium, quartz, sapphire, and glass could alternatively be used for the first wafer 310 and the second wafer 320. In addition, each of the first wafer 310 and the second wafer 320 may contain Complementary Metal-Oxide-Semiconductor (CMOS) circuits, sensors/actuators, passive devices, Wafer Level Chip Scale Package (WLCSP), interposers, etc. However, embodiments of the present disclosure are not limited thereto.

The second wafer 320 has a size the same as that of the first wafer 310. In this embodiment, the first wafer 310 and the second wafer 320 are circular wafer, and a diameter of the second wafer 320 is the same as a diameter of the first wafer 310, and thus the second wafer 320 has a width the same as a width of the first wafer 310 in the cross-sectional view of FIG. 3b. The second wafer 320 has a bottom portion 322 bonded on a top portion 312 of the first wafer 310, and cross-sectional views of the top portion 312 and the bottom portion 322 has rounded corners.

Figure 3C:
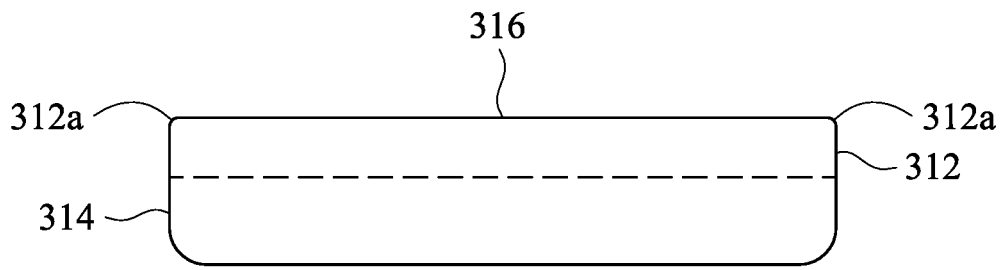
FIG. 3c is a cross-sectional view of a first wafer in accordance with some embodiments.
Figure 3D:
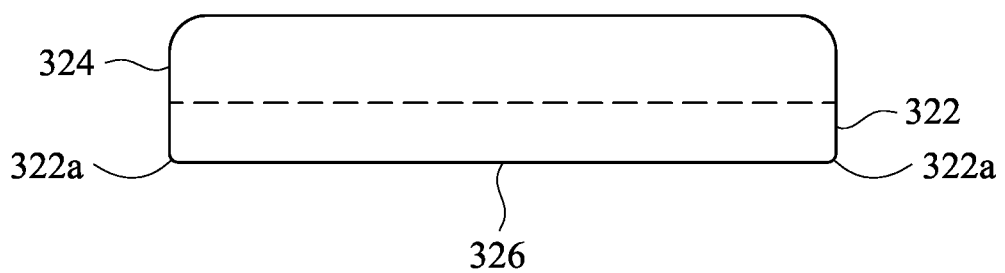
FIG. 3d is a cross-sectional view of a second wafer in accordance with some embodiments.
Figure 3E:
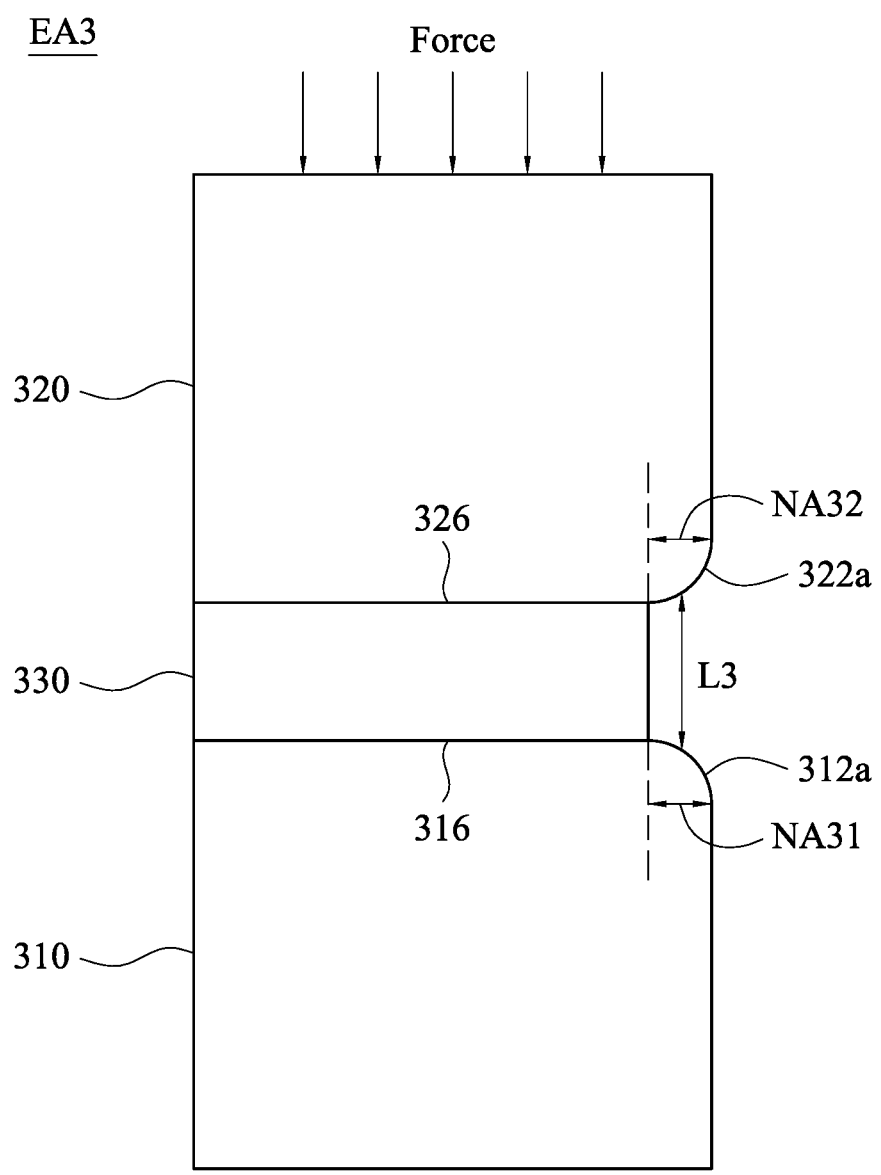
FIG. 3e is an enlarged diagram showing the area EA3 in FIG. 3b.

Referring to FIG. 3c and FIG. 3d, FIG. 3c is a cross-sectional view of the first wafer 310 in accordance with some embodiments of the present disclosure, and FIG. 3d is a cross-sectional view of the second wafer 320 in accordance with some embodiments of the present disclosure. The top portion 312 of the first wafer 310 has the rounded corners 312a, and the rounded corners 312a are defined by a side surface 314 and a top surface 316 of the first wafer 310. Similarly, the bottom portion 322 of the second wafer 320 has the rounded corners 322a, and the rounded corners 322a are defined by a side surface 324 and a bottom surface 326 of the second wafer 320. In this embodiment, each of the rounded corners 312a and 322a is designed to have a small radius, thereby decreasing an area of a non-bonded area NA31 of the first wafer 310 and an area of a non-bonded area NA32 of the second wafer 320, as shown in FIG. 3e. In this embodiment, a portion of the bottom surface 326 from an edge of the second wafer 320 to a location contacting the oxide layer 330 is defined as the non-bonded area NA31, and a portion of the top surface 313 from an edge of the first wafer 310 to a location contacting the oxide layer 330 is defined as the non-bonded area NA32.

Referring to FIG. 3e, FIG. 3e is an enlarged diagram showing the area EA3 in FIG. 3b. When a thin-down process is performed on the semiconductor device 300 to decrease a thickness of the second wafer 320, a force is applied on the second wafer 320 and causes the edge of the second wafer 320 chipping. The chipping risk of the second wafer 320 has a positive correlation to a distance L3 between the non-bonded area NA31 and the non-bonded area NA32, and the distance L3 has a positive correlation to areas of the non-bonded areas NA31 and NA 32. In this embodiment, to decrease the chipping risk of the second wafer 320, the first wafer 310 and the second wafer 320 are designed to have small rounded corners 312a and 322a to decrease areas of the non-bonded areas NA31 and NA32, and the distance L3 is deceased accordingly. Since the distance L3 is decreased, the chipping risk of the second wafer 320 is decreased. For example, comparing to a wafer stack having a standard wafer (also referred to as conventional top wafer) bonded on another standard wafer (also referred to as conventional bottom wafer), the second wafer 320 has a chipping risk less than that of the top wafer when the thin-down process is performed, since the conventional top wafer and the conventional bottom wafer has corners larger than those of the first wafer 310 and the second wafer 320.

Similarly, the top portion 312 of the first wafer 310 and the bottom portion 322 of the second wafer 320 can be designed to have the rounded corner RC1, the rounded corner RC2, or the rounded corner RC3 as shown in FIG. 1f. In some embodiments, each of the rounded corner 312a and the rounded corner 322a has a non-bonded area having a width smaller than 0.5 mm. In some embodiments, each of the rounded corner 312a of and the rounded corner 322a has a non-bonded area having a width smaller than 0.3 mm.

Figure 4A:
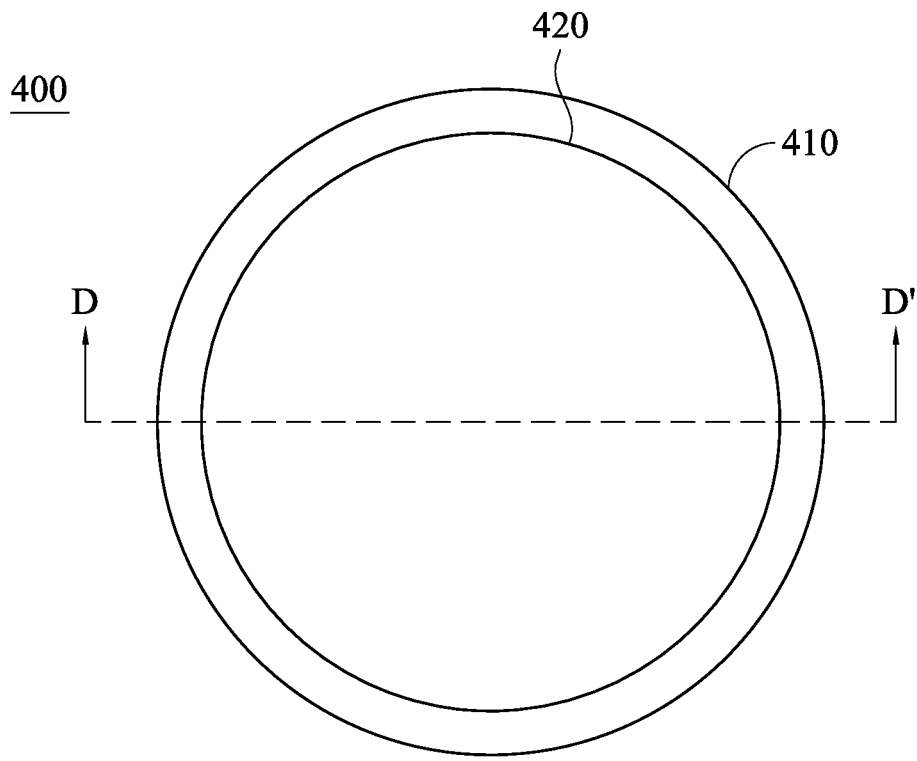
FIG. 4a is a top view of a semiconductor device in accordance with some embodiments.
Figure 4B:
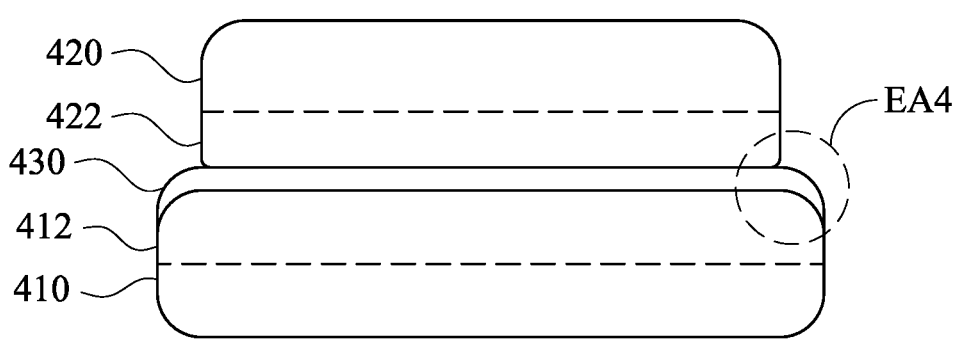

Referring to FIG. 4a and FIG. 4b, FIG. 4a is a top view of a semiconductor device 400 in accordance with some embodiments of the present disclosure, and FIG. 4b is a cross-sectional view along a cutline D-D' in FIG. 4a. The semiconductor device 400 is a wafer stack including a first wafer 410 and a second wafer 420. The first wafer 410 is a standard wafer having a standard configuration, and the second wafer 420 is bonded on the first wafer 410. In this embodiment, an oxide layer 430 is disposed between the first wafer 410 and the second wafer 420 for fusion bonding. For example, the oxide layer 430 is disposed on the first wafer 410, and then the second wafer 420 is bonded on the first wafer 410 through the oxide layer 430. However, embodiments of the present disclosure are not limited thereto. In some embodiments, the second wafer 420 is bonded on the first wafer 410 by an anodic bonding process or an adhesive bonding process.

Each of the first wafer 410 and the second wafer 420 may be a semiconductor material and may include structures including a graded layer or a buried oxide, for example. In some embodiments, each of the first wafer 410 and the second wafer 420 includes bulk silicon that may be undoped or doped (e.g., p-type, n-type, or a combination thereof). Other materials that are suitable for semiconductor device formation may be used. Other materials, such as, fused silica, germanium, quartz, sapphire, and glass could alternatively be used for the first wafer 410 and the second wafer 420. In addition, each of the first wafer 410 and the second wafer 420 may contain Complementary Metal-Oxide-Semiconductor (CMOS) circuits, sensors/actuators, passive devices, Wafer Level Chip Scale Package (WLCSP), interposers, etc. However, embodiments of the present disclosure are not limited thereto.

The second wafer 420 has a size smaller than that of the first wafer 410. In this embodiment, the first wafer 410 and the second wafer 420 are circular wafer, and a diameter of the second wafer 420 is smaller than a diameter of the first wafer 410, and thus the second wafer 420 has a width smaller than a width of the first wafer 410 in the cross-sectional view of FIG. 4b. In this embodiment, the diameter of the second wafer 420 is smaller than that of the first wafer 410 by 0.1 mm to 10 mm, but embodiments of the present disclosure are not limited thereto. The second wafer 420 has a bottom portion 422 bonded on a top portion 412 of the first wafer 410, and cross-sectional views of the top portion 412 and the bottom portion 422 has rounded corners.

Figure 4C:
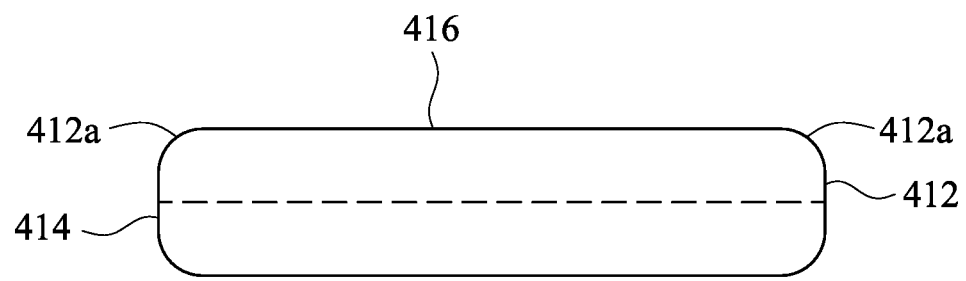
FIG. 4c is a cross-sectional view of a first wafer in accordance with some embodiments.
Figure 4D:
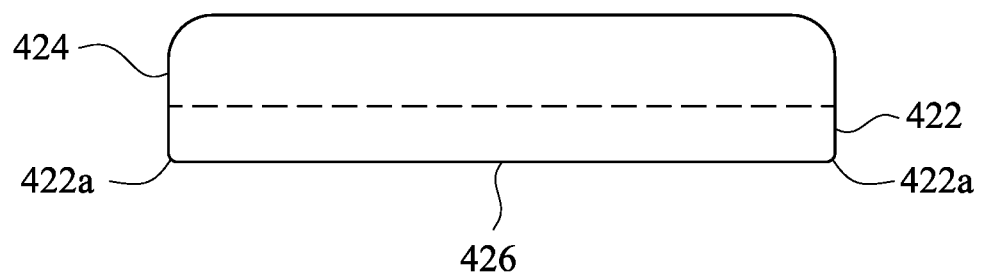
FIG. 4d is a cross-sectional view of a second wafer in accordance with some embodiments.
Figure 4E:
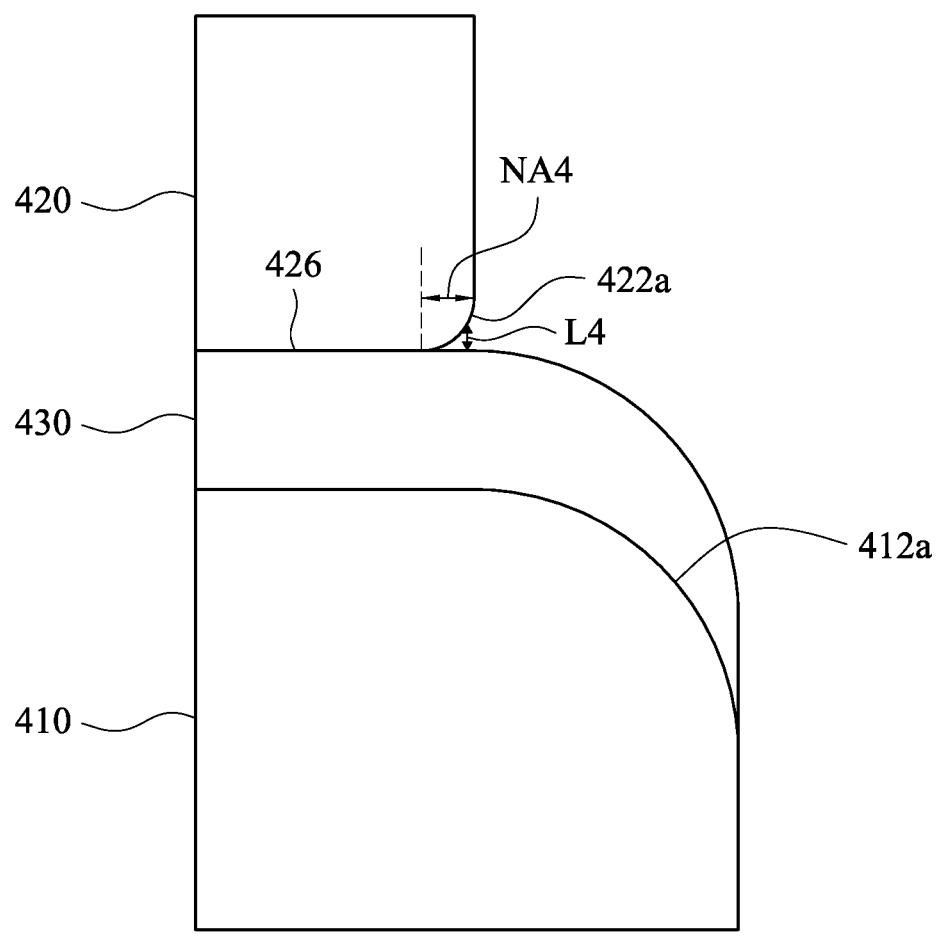
FIG. 4e is an enlarged diagram showing the area EA4 in FIG. 4b.

Referring to FIG. 4c and FIG. 4d, FIG. 4c is a cross-sectional view of the first wafer 110 in accordance with some embodiments of the present disclosure, and FIG. 4d is a cross-sectional view of the second wafer 420 in accordance with some embodiments of the present disclosure. The top portion 412 of the first wafer 410 has the rounded corners 412a, and the rounded corners 412a are defined by a side surface 414 and a top surface 416 of the first wafer 410. Similarly, the bottom portion 422 of the second wafer 420 has the rounded corners 422a, and the rounded corners 422a are defined by a side surface 424 and a bottom surface 426 of the second wafer 420. In this embodiment, a size of the second wafer 420 is designed to be smaller than that of the first wafer 410, and each of the rounded corners 422a is designed to have a radius smaller than that of each of the rounded corners 412a, thereby decreasing an area of a non-bonded area NA4 of the second wafer 420, as shown in FIG. 4e. In this embodiment, a portion of the bottom surface 426 from an edge of the second wafer 420 to a location contacting the oxide layer 430 is defined as the non-bonded area NA4.

Referring to FIG. 4e, FIG. 4e is an enlarged diagram showing the area EA4 in FIG. 4b. When a thin-down process is performed on the semiconductor device 400 to decrease a thickness of the second wafer 420, a force is applied on the second wafer 420 and causes the edge of the second wafer 420 chipping. The chipping risk of the second wafer 420 has a positive correlation to a distance L4 between the oxide layer 430 and the non-bonded area NA4 of the second wafer 420, and the distance L4 has a positive correlation to an area of the non-bonded area NA4. In this embodiment, to decrease the chipping risk of the second wafer 420, the second wafer 420 is designed to have a small size and to have the rounded corners 122a to decrease an area of the non-bonded area NA4, and the distance L4 is deceased accordingly. Since the distance L4 is decreased, the chipping risk of the second wafer 420 is decreased. For example, comparing to a wafer stack having a standard wafer (also referred to as conventional top wafer) bonded on another standard wafer, the second wafer 420 has a chipping risk less than that of the top wafer when the thin-down process is performed, since the conventional top wafer has a size larger than that of the second wafer 420, and the conventional top wafer has corners larger than those of the second wafer 420.

Similarly, the top portion 412 of the first wafer 410 and the bottom portion 422 of the second wafer 420 can be designed to have the rounded corner RC1, the rounded corner RC2, or the rounded corner RC3 as shown in FIG. 1f. In some embodiments, each of the rounded corner 412a and the rounded corner 422a has a non-bonded area having a width smaller than 0.5 mm. In some embodiments, each of the rounded corner 412a of and the rounded corner 422a has a non-bonded area having a width smaller than 0.3 mm.

Figure 5A:
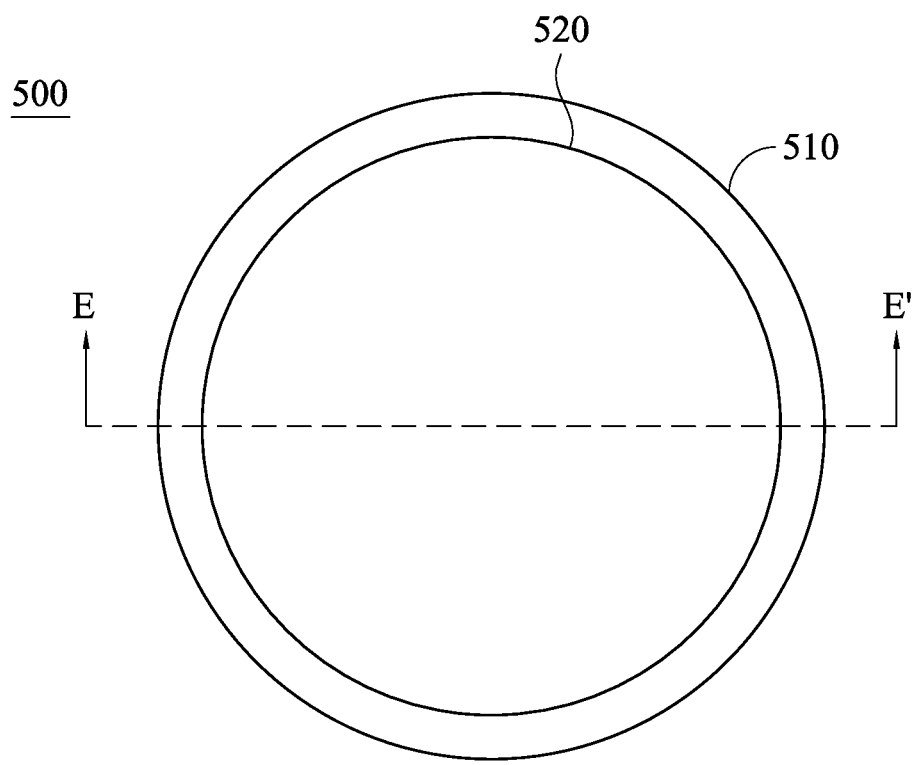
FIG. 5a is a top view of a semiconductor device in accordance with some embodiments.
Figure 5B:
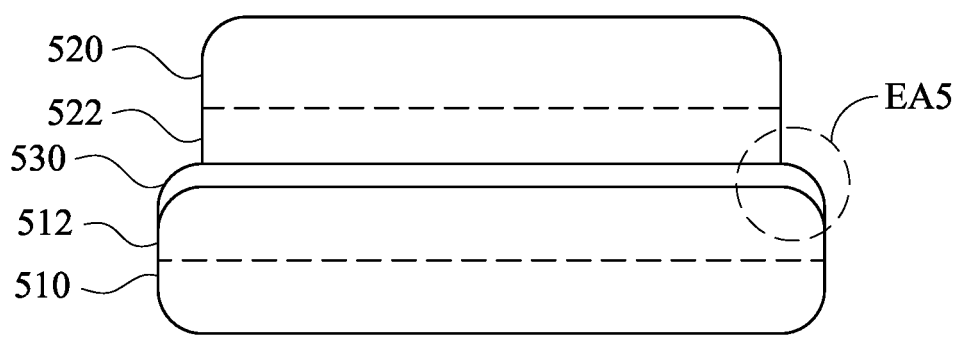

Referring to FIG. 5a and FIG. 5b, FIG. 5a is a top view of a semiconductor device 500 in accordance with some embodiments of the present disclosure, FIG. 5b is a cross-sectional view along a cutline E-E' in FIG. 5a. The semiconductor device 500 is a wafer stack including a first wafer 510 and a second wafer 520. The first wafer 510 is a standard wafer having a standard configuration, and the second wafer 520 is bonded on the first wafer 510. In this embodiment, an oxide layer 530 is disposed between the first wafer 510 and the second wafer 520 for fusion bonding. For example, the oxide layer 530 is disposed on the first wafer 510, and then the second wafer 520 is bonded on the first wafer 510 through the oxide layer 530. However, embodiments of the present disclosure are not limited thereto. In some embodiments, the second wafer 520 is bonded on the first wafer 510 by an anodic bonding process or an adhesive bonding process.

Each of the first wafer 510 and the second wafer 520 may be a semiconductor material and may include structures including a graded layer or a buried oxide, for example. In some embodiments, each of the first wafer 510 and the second wafer 520 includes bulk silicon that may be undoped or doped (e.g., p-type, n-type, or a combination thereof). Other materials that are suitable for semiconductor device formation may be used. Other materials, such as, fused silica, germanium, quartz, sapphire, and glass could alternatively be used for the first wafer 510 and the second wafer 520. In addition, each of the first wafer 510 and the second wafer 520 may contain Complementary Metal-Oxide-Semiconductor (CMOS) circuits, sensors/actuators, passive devices, Wafer Level Chip Scale Package (WLCSP), interposers, etc. However, embodiments of the present disclosure are not limited thereto.

The second wafer 520 has a size smaller than that of the first wafer 510. In this embodiment, the first wafer 510 and the second wafer 420 are circular wafer, and a diameter of the second wafer 520 is smaller than a diameter of the first wafer 510, and thus the second wafer 520 has a width smaller than a width of the first wafer 510 in the cross-sectional view of FIG. 5b. In this embodiment, the diameter of the second wafer 520 is smaller than that of the first wafer 510 by 0.1 mm to 10 mm, but embodiments of the present disclosure are not limited thereto. The second wafer 520 has a bottom portion 522 bonded on a top portion 512 of the first wafer 510, and a cross-sectional view of the bottom portion 522 has rounded corners.

Figure 5C:
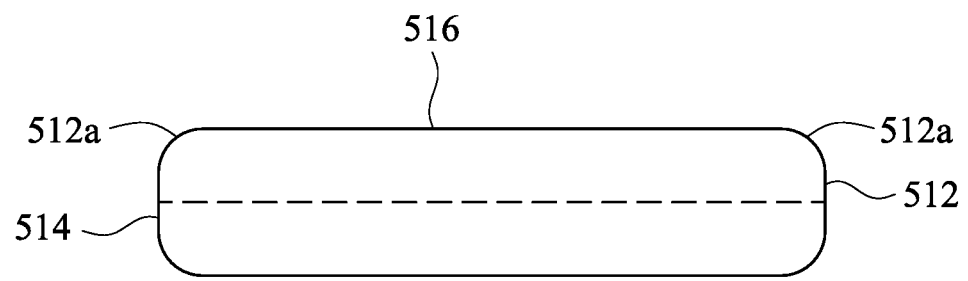
FIG. 5c is a cross-sectional view of a first wafer in accordance with some embodiments.
Figure 5D:
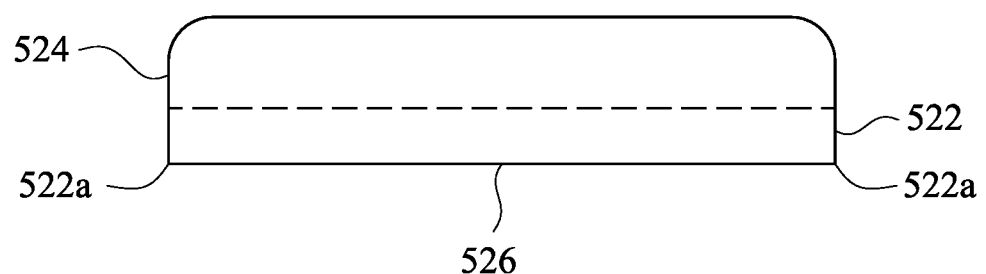
FIG. 5d is a cross-sectional view of a second wafer in accordance with some embodiments.

Referring to FIG. 5c and FIG. 5d, FIG. 5c is a cross-sectional view of the first wafer 510 in accordance with some embodiments of the present disclosure, and FIG. 5d is a cross-sectional view of the second wafer 520 in accordance with some embodiments of the present disclosure. The top portion 512 of the first wafer 510 has the rounded corners 512a, and the rounded corners 512a are defined by a side surface 514 and a top surface 516 of the first wafer 510. Similarly, the bottom portion 522 of the second wafer 520 has the right angle corners 522a, and the right angle corners 522a are defined by a side surface 524 and a bottom surface 526 of the second wafer 520. In this embodiment, a size of the second wafer 520 is designed to be smaller than that of the first wafer 510, and each of the rounded corners 522a is designed to have a right angle corner, thereby eliminating a non-bonded area the second wafer 520, as shown in FIG. 5e.

Figure 5E:
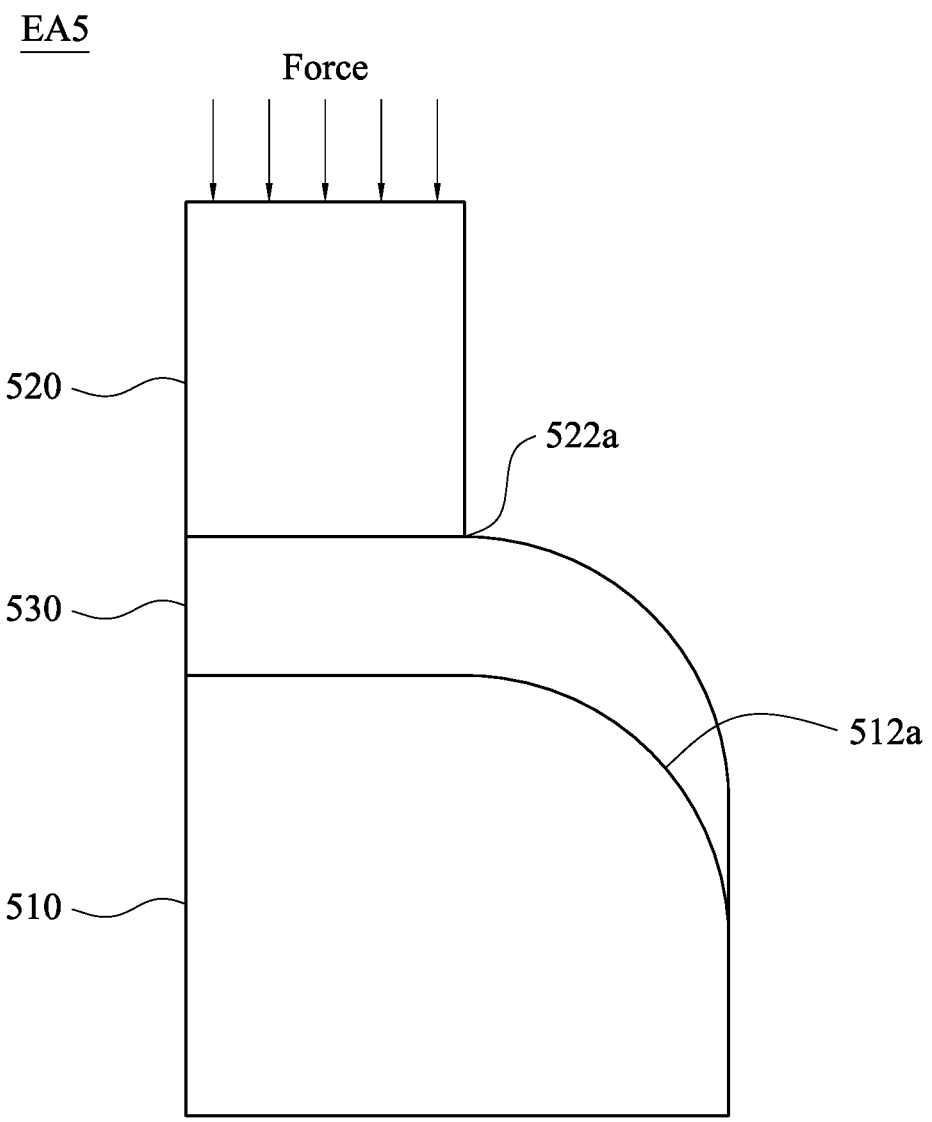
FIG. 5e is an enlarged diagram showing the area EA4 in FIG. 5b.

Referring to FIG. 5e, FIG. 5e is an enlarged diagram showing the area EA5 in FIG. 5b. As shown in FIG. 5, the bottom portion 522 of the second wafer 520 does not have any non-bonded area since the size of the second wafer 520 is designed to be smaller than that of the first wafer 510 and each of the rounded corners 522a is designed to have a right angle corner. Therefore, chipping of the second wafer 520 is prevented when a thin-down process is performed on the semiconductor device 500.

Figure 6:
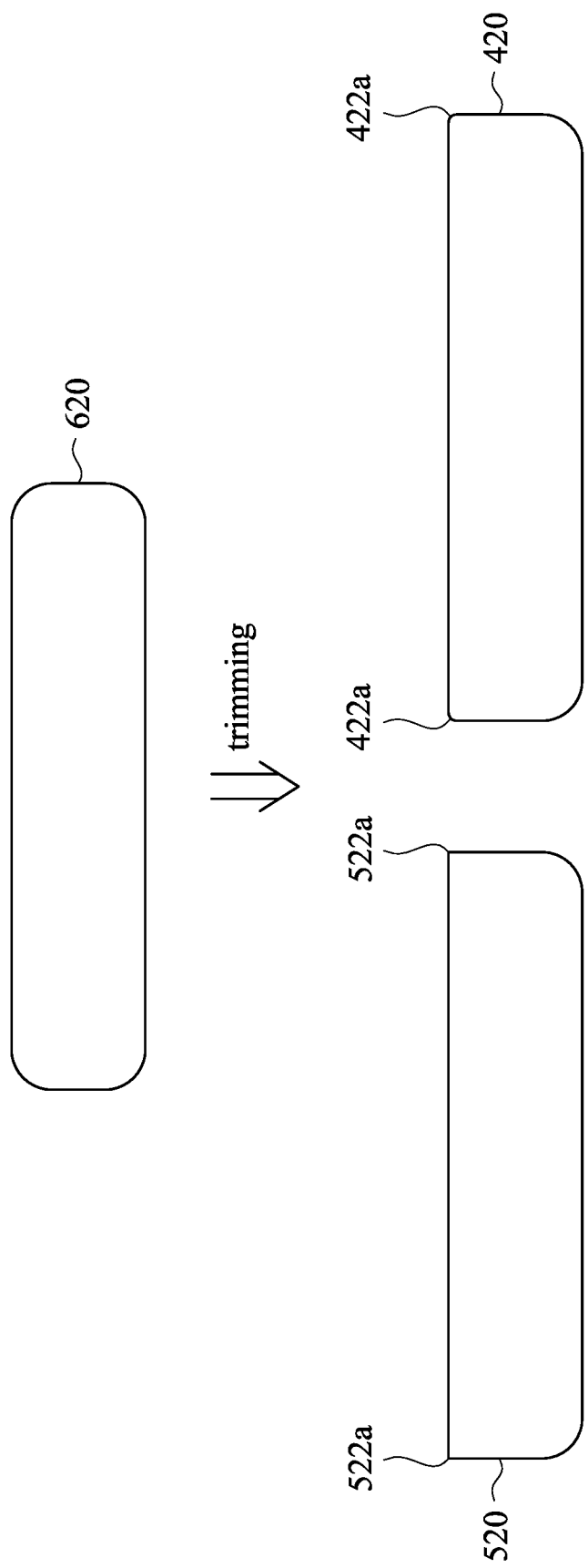
FIG. 6 is a schematic diagram showing an operation for proving the wafers 420 and 520 in accordance with some embodiments.

Referring to FIG. 6, FIG. 6 is a schematic diagram showing an operation for proving the wafers 420 and 520 in accordance with some embodiments of present disclosure. As shown in FIG. 6, a wafer 600 having a size smaller than that of a standard wafer is provided at first. Then, a trimming process is performed to a top portion of the wafer 600 to form the corners 422a each having a small radius or to form the corners 522a each having a right angle.

Figure 7:
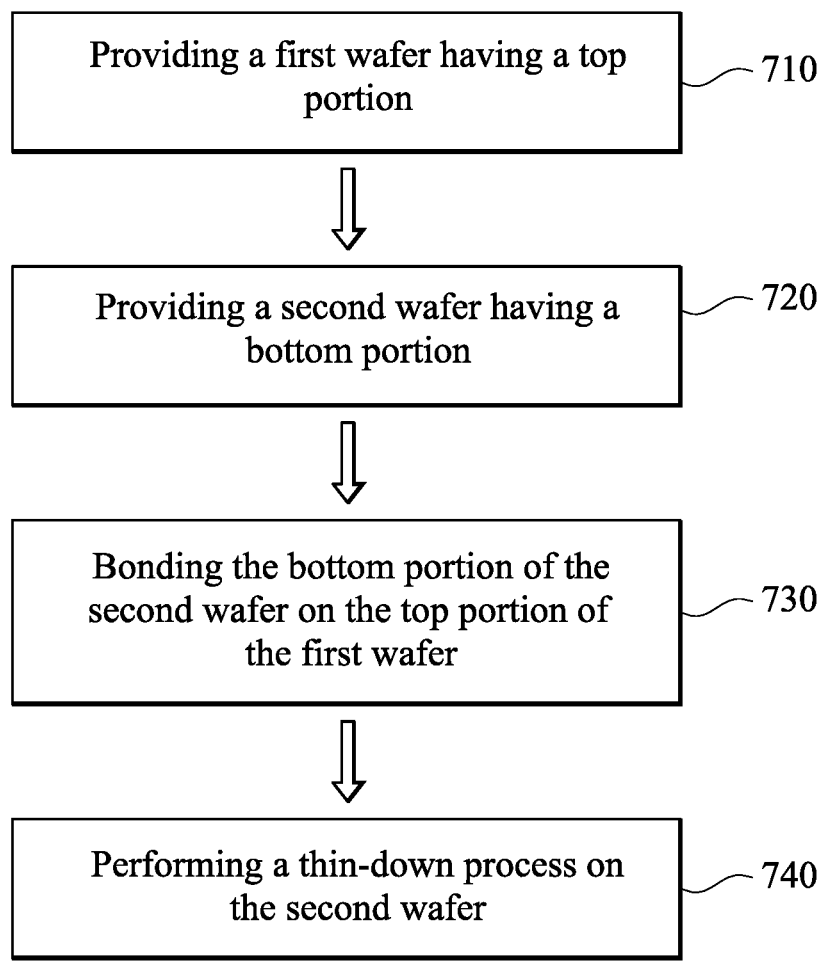
FIG. 7 is a flow chart showing a fabrication method of a wafer stack in accordance with some embodiments.

Referring to FIG. 7, FIG. 7 is a flow chart showing a fabrication method 700 of a wafer stack in accordance with some embodiments of the present invention. In the fabrication method 700, at first, an operation 710 is performed to provide a first wafer such as the first wafer 110/210/310/410/510 shown in FIG. 1c, FIG. 2c, FIG. 3c, FIG. 4c and FIG. 5c. In some embodiments, the first wafer is a standard wafer having a standard configuration. Then, an operation 720 is performed to provide a second wafer, such as the second wafer 120/220/320/420/520 shown in FIG. 1d, FIG. 2d, FIG. 3d, FIG. 4d and FIG. 5d. In some embodiments, the second wafer has a size the same as or smaller than that of the first wafer. In some embodiments, a bottom portion of the second wafer has corners each having a radius smaller than that of each corners of a top portion of the first wafer. In some embodiments, a bottom portion of the second wafer has right angle corners. Thereafter, an operation 730 is performed to bond the bottom portion of the second wafer on the top portion of the first wafer as shown in FIG. 1b, FIG. 2b, FIG. 3b, FIG. 4b and FIG. 5b. In some embodiments, the second wafer is bonded on the first wafer by a fusion boding process. In some embodiments, the second wafer is bonded on the first wafer by anodic bonding process or an adhesive bonding process. Then, an operation 740 is performed to thin-down the second wafer as shown in FIG. 1e, FIG. 2c, FIG. 3e, FIG. 4e and FIG. 5e.

Figure 8A:
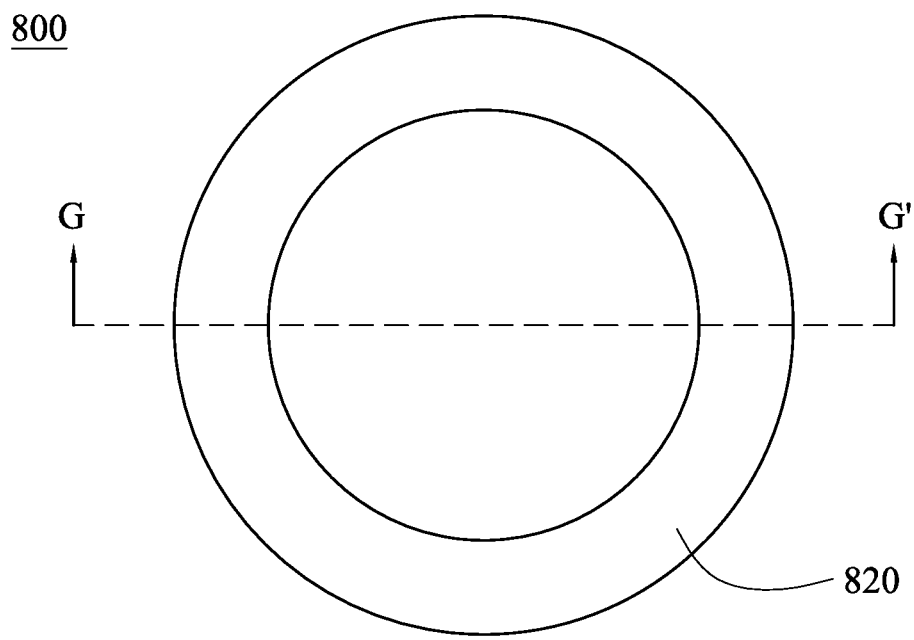
FIG. 8a is a top view of a semiconductor device in accordance with some embodiments.
Figure 8B:
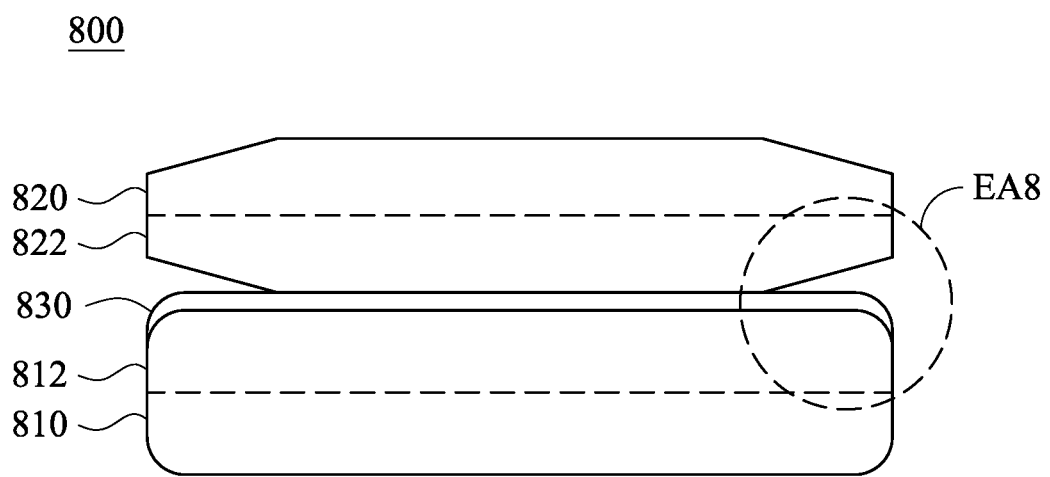

Referring to FIG. 8a and FIG. 8b, FIG. 8a is a top view of a semiconductor device 800 in accordance with some embodiments of the present disclosure, and FIG. 8b is a cross-sectional view along a cut line G-G' in FIG. 8a. The semiconductor device 800 is a wafer stack including a first wafer 810 and a second wafer 820. The first wafer 810 is a standard wafer having a standard configuration, and the second wafer 820 is bonded on the first wafer 810. In this embodiment, an oxide layer 830 is disposed between the first wafer 810 and the second wafer 820 for fusion bonding. For example, the oxide layer 830 is disposed on the first wafer 810, and then the second wafer 820 is bonded on the first wafer 810 through the oxide layer 830. However, embodiments of the present disclosure are not limited thereto. In some embodiments, the second wafer 820 is bonded on the first wafer 810 by an anodic bonding process or an adhesive bonding process.

Each of the first wafer 810 and the second wafer 820 may be a semiconductor material and may include structures including a graded layer or a buried oxide, for example. In some embodiments, each of the first wafer 810 and the second wafer 820 includes bulk silicon that may be undoped or doped (e.g., p-type, n-type, or a combination thereof). Other materials that are suitable for semiconductor device formation may be used. Other materials, such as, fused silica, germanium, quartz, sapphire, and glass could alternatively be used for the first wafer 810 and the second wafer 820. In addition, each of the first wafer 810 and the second wafer 820 may contain Complementary Metal-Oxide-Semiconductor (CMOS) circuits, sensors/actuators, passive devices, Wafer Level Chip Scale Package (WLCSP), interposers, etc. However, embodiments of the present disclosure are not limited thereto.

The second wafer 820 has a size the same as that of the first wafer 810. In this embodiment, the first wafer 810 and the second wafer 820 are circular wafer, and a diameter of the second wafer 820 is the same as a diameter of the first wafer 810, and thus the second wafer 820 has a width the same as a width of the first wafer 810 in the cross-sectional view of FIG. 8b. The first wafer 810 has a top portion 812 bonded on a bottom portion 822 of the second wafer 820, and a cross-sectional views of the top portion 812 has rounded corners.

Figure 8C:
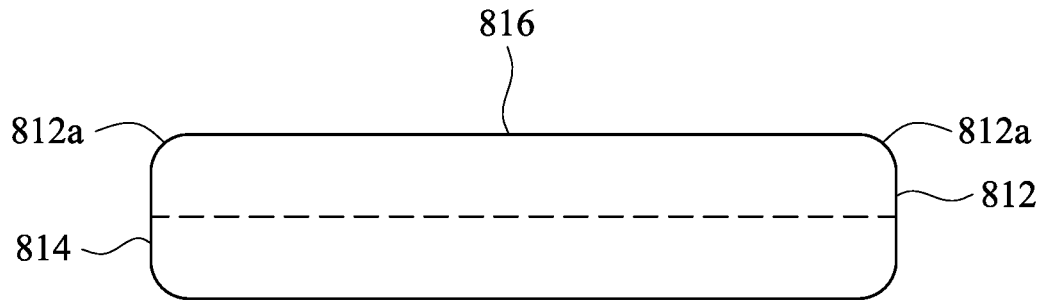
FIG. 8c is a cross-sectional view of a first wafer in accordance with some embodiments.
Figure 8D:
FIG. 8d is a cross-sectional view of a second wafer in accordance with some embodiments.

Referring to FIG. 8c and FIG. 8d, FIG. 8c is a cross-sectional view of the first wafer 810 in accordance with some embodiments of the present disclosure, and FIG. 8d is a cross-sectional view of the second wafer 820 in accordance with some embodiments of the present disclosure. The top portion 812 of the first wafer 810 has the rounded corners 812a, and the rounded corners 812a are defined by a side surface 814 and a top surface 816 of the first wafer 810. The second wafer 220 has two end portions having a bullet shape. The bullet-shape end portion has an inclined surface 822a located between a side surface 824 and a bottom surface 826 of the second wafer 820.

Figure 8E:
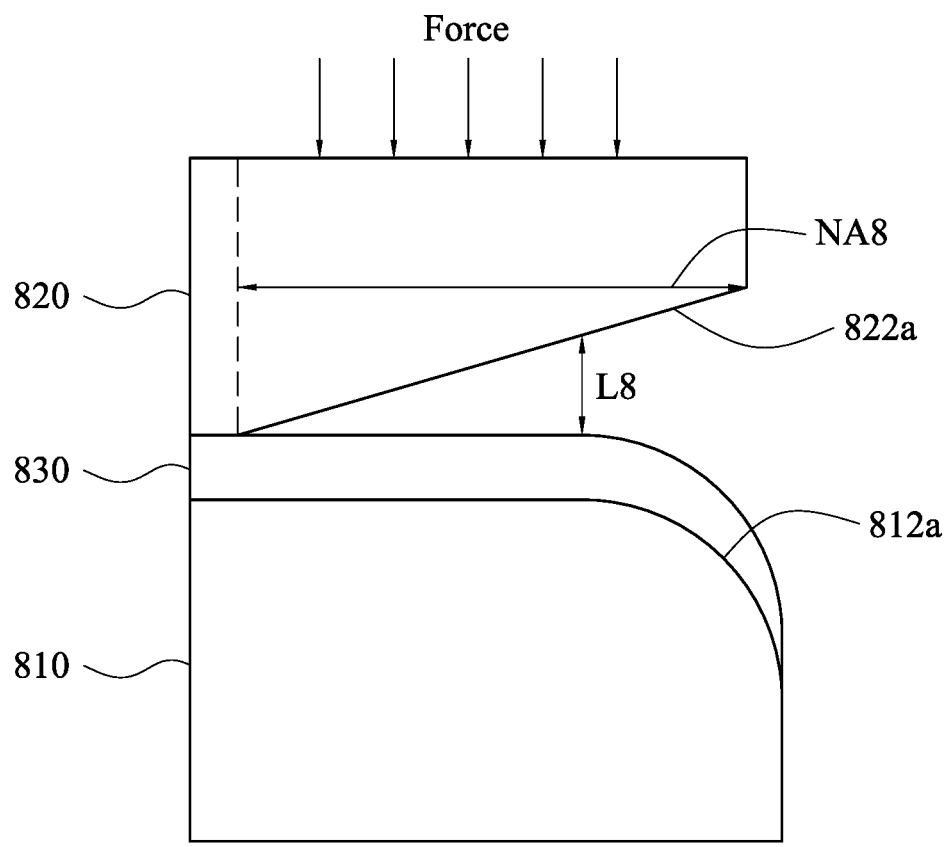
FIG. 8e is an enlarged diagram showing the area EA4 in FIG. 8b.

Referring to FIG. 8e, FIG. 8e is an enlarged diagram showing an area EA8 in FIG. 8b. When a thin-down process is performed on the semiconductor device 800 to decrease a thickness of the second wafer 820, a force is applied on the second wafer 820 and causes the edge of the second wafer 820 chipping. The chipping risk of the second wafer 820 has a positive correlation to a distance L8 between the oxide layer 830 and the non-bonded area NA8 of the second wafer 820, and the distance L8 has a positive correlation to an area of the non-bonded area NA8. In this embodiment, to decrease the chipping risk of the second wafer 220, the non-bonded area NA8 is configured to have a width smaller than 0.5 mm, and a portion of the bottom surface 826 from an edge of the second wafer 820 to a location contacting the oxide layer 830 is defined as the non-bonded area NA8.

In some embodiments, the first wafer 810 can be configured to have the bullet-shape end portions, too.

In the above embodiments, although the semiconductor device includes two wafers, but embodiments of the present disclosure are not limited thereto. In some embodiments, a third wafer can be further bonded on the second wafer. In some embodiments, the third wafer has a size the same as or smaller than that of the second wafer. In some embodiments, a bottom portion of the second wafer has corners each having a radius smaller than that of each corners of a top portion of the second wafer. In some embodiments, a bottom portion of the third wafer has right angle corners. It is noted that a number of the wafers included by the semiconductor device of the present disclosure can be changed in accordance with actual demands.

In accordance with an embodiment, the present disclosure discloses a semiconductor device. The semiconductor device includes a first wafer and a second wafer. The first wafer has a top portion, wherein a cross-sectional view of the first wafer has a first wafer width. The second wafer is disposed on the top portion of the first wafer, wherein the second wafer has a bottom portion bonded on the top portion of the first wafer, and a cross-sectional view of the second wafer has a second wafer width smaller than the first wafer width of the first wafer, and a non-bonded area of the bottom portion of the second wafer has a width smaller than 0.5 mm.

In accordance with another embodiment, the present disclosure discloses a semiconductor device. The semiconductor device includes a first wafer and a second wafer. The first wafer has a top portion, wherein a cross-sectional view of the top portion of the first wafer has a first wafer width. The second wafer is disposed on the top portion of the first wafer, wherein the second wafer has a bottom portion bonded on the top portion of the first wafer, and a cross-sectional view of the bottom portion of the second wafer has a second wafer width, and the second wafer width is the same as the first wafer width, and a non-bonded area of the bottom portion of the second wafer has a width smaller than 0.5 mm.

In accordance with yet another embodiment, the present disclosure discloses a fabrication method of a semiconductor device. In this method, at first, a first wafer having a top portion is provided, wherein a cross-sectional view of the top portion of the first wafer has a first wafer width. Then, a second wafer having a bottom portion is provided, wherein a cross-sectional view of the bottom portion of the second wafer has a second wafer width smaller than or equal to the first wafer width. Thereafter, the bottom portion of the second wafer is bonded on the top portion of the first wafer, in which a non-bonded area of the bottom portion of the second wafer has a width smaller than 0.5 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first wafer having a top portion, wherein the top portion has a top surface, a side surface, and a non-bonded area between the top and side surfaces thereof; and
   a second wafer having a bottom surface bonded on the top surface of the first wafer with a bonding layer, a side surface, and a non-bonded area between the bottom and side surfaces of the second wafer, wherein the bonding layer has a tapered portion that becomes narrower toward the side surface of the first wafer, wherein the side surface of the first wafer is free from coverage by the bonding layer, the tapered portion extends from the top surface to the side surface of the first wafer, the second wafer has a second wafer width smaller than a first wafer width of the first wafer and the non-bonded area of the first wafer is covered with the tapered portion of the bonding layer, the non-bonded area of the first wafer has a first width in a diameter direction of the bottom surface of the second wafer, the non-bonded area of the second wafer has a second width in the diameter direction of the bottom surface of the second wafer, the second width of the non-bonded area of the second wafer is smaller than the first width of the non-bonded area of the first wafer, a maximum distance between the bonding layer and the non-bonded area of the second wafer in a vertical direction is less than a thickness of the bonding layer in the vertical direction, and the vertical direction is perpendicular to the diameter direction.

2. The semiconductor device of claim 1, wherein a bottom portion of the second wafer is bonded on the top portion of the first wafer by a fusion bonding process, an anodic bonding process, or an adhesive bonding process.

3. The semiconductor device of claim 1, wherein a bottom portion of the second wafer is located within an area defined by the top portion of the first wafer.

4. The semiconductor device of claim 1, wherein a cross-sectional view of a bottom portion of the second wafer has a plurality of right angle corners.

5. The semiconductor device of claim 1, wherein a cross-sectional view of the top portion of the first wafer has a plurality of first rounded corners, and a cross-sectional view of a bottom portion of the second wafer has a plurality of second rounded corners having a radius smaller than that of the first rounded corners.

6. The semiconductor device of claim 1, further comprising a third wafer disposed on the second wafer, wherein the third wafer has a bottom portion bonded on a top portion of the second wafer, and a cross-sectional view of the third wafer has a third wafer width smaller than or equal to the second wafer width of the second wafer.

7. A semiconductor device, comprising:
a first wafer having a topmost portion and a bottom portion, wherein the topmost portion has a topmost surface, a first side surface, and a non-bonded area between the topmost surface and first side surface thereof and the bottom portion has a bottom surface, a second side surface, and a rounded corner between the bottom surface and the second side surface thereof, wherein the non-bonded area between the topmost surface and the first side surface of the first wafer has a smaller radius than the rounded corner of the first wafer, wherein the non-bonded area has a continuously curved surface extending from the topmost surface of the topmost portion of the first wafer to the first side surface of the topmost portion of the first wafer, and the continuously curved surface of the non-bonded area of the first wafer has the smaller radius than the rounded corner of the first wafer; and
a second wafer having a bottom surface bonded on the top surface of the first wafer, a top surface, a side surface, and a non-bonded area between the bottom and side surfaces of the second wafer, wherein the second wafer has a second maximum wafer width the same as a first maximum wafer width of the first wafer, the first side surface of the first wafer is substantially aligned with the side surface of the second wafer, and the top and side surfaces of the second wafer form a first rounded corner having a radius greater than a radius of the non-bonded area between the bottom and side surfaces of the second wafer.

8. A fabrication method of a semiconductor device, comprising:
providing a first wafer having a top portion, wherein the top portion has a top surface, a side surface, and a non-bonded area having a first round corner between the top and side surfaces thereof;
providing a second wafer such that the second wafer has the same width as the first wafer and such that the second wafer has a bottom surface, a side surface, a non-bonded area having a second round corner between the bottom and side surfaces of the second wafer, the second round corner of the non-bonded area of the second wafer having a radius smaller than that of the first round corner of the non-bonded area of the first wafer, and the side surface of the second wafer is substantially perpendicular to the top surface of the top portion of the first wafer; and
bonding the bottom surface of the second wafer on the top surface of the first wafer with a bonding layer comprising a tapered portion becoming narrower toward the side surface of the first wafer such that the tapered portion of the bonding layer covers the non-bonded area of the first wafer but not the non-bonded area of the second wafer, wherein the tapered portion extends from the top surface to the side surface of the first wafer, and the non-bonded area of the second wafer is spaced apart from the bonding layer and has a substantially flat bottom surface directly above the tapered portion of the bonding layer.

9. The fabrication method of claim 8, further comprising: performing a thin-down process on the second wafer after the operation for bonding a bottom portion of the second wafer on the top portion of the first wafer to decrease a thickness of the second wafer.

10. The fabrication method of claim 9, wherein the thin-down process applies a force on a top portion of the second wafer, and the bonding process is a fusion bonding process, an anodic bonding process, or an adhesive bonding process.

11. The fabrication method of claim 8, wherein a cross-sectional view of the top portion of the second wafer has a third rounded corner, and a cross-sectional view of a bottom portion of the second wafer has the second rounded corner having a radius smaller than that of the third rounded corner of the top portion of the second wafer.

12. The fabrication method of claim 8, wherein a cross-sectional view of a bottom portion of the second wafer has a plurality of right angle corners.

13. The fabrication method of claim 8, further comprising providing the second wafer such that the non-bonded area thereof tapers from the bottom surface thereof to the side surface thereof.

14. The semiconductor device of claim 7, further comprising a bonding layer between the first wafer and the second wafer, and the bonding layer does not cover the non-bonded areas of the first and second wafers.

15. The semiconductor device of claim 1, wherein the side surface of the second wafer is substantially perpendicular to the top surface of the top portion of the first wafer.

16. The semiconductor device of claim 1, wherein the second wafer comprises a top portion, a cross-sectional view of the top portion of the second wafer has a first rounded corner, and a cross-sectional view of the non-bonded area of the second wafer has a second rounded corner having a radius smaller than that of the first rounded corner.

17. The semiconductor device of claim 7, wherein the side surface of the second wafer is substantially perpendicular to the topmost surface of the first wafer.

18. The semiconductor device of claim 7, wherein the side surface of the first wafer is substantially perpendicular to the bottom surface of the second wafer.

19. The semiconductor device of claim 7, wherein the non-bonded area of the first wafer has a first width in a diameter direction of the bottom surface of the second wafer, the non-bonded area of the second wafer has a second width in the diameter direction of the bottom surface of the second wafer, and the second width of the non-bonded area of the second wafer is substantially the same as the first width of the non-bonded area of the first wafer.

20. The semiconductor device of claim 1, wherein the second width in the diameter direction of the bottom surface of the second wafer is less than the thickness of the bonding layer in the vertical direction.

\* \* \* \* \*